US009137855B2

(12) United States Patent
Umeda (10) Patent No.: US 9,137,855 B2
(45) Date of Patent: Sep. 15, 2015

(54) AC VOLTAGE DETECTION CIRCUIT, HEATER CONTROL DEVICE AND IMAGE FORMING DEVICE

(71) Applicant: Seiko Epson Corporation, Tokyo (JP)

(72) Inventor: Atsushi Umeda, Azumino (JP)

(73) Assignee: Seiko Epson Corporation, Shiojiri-Shi (JP)

( * ) Notice: Subject to any disclaimer, the term of this patent is extended or adjusted under 35 U.S.C. 154(b) by 245 days.

(21) Appl. No.: 13/768,393

(22) Filed: Feb. 15, 2013

(65) Prior Publication Data

US 2013/0215163 A1 Aug. 22, 2013

(30) Foreign Application Priority Data

Feb. 17, 2012 (JP) ................. 2012-032559

(51) Int. Cl.
*B41J 2/01* (2006.01)
*B23K 13/08* (2006.01)
*G01R 19/22* (2006.01)
*H05B 1/02* (2006.01)
*G03G 15/00* (2006.01)
*G03G 15/20* (2006.01)
*G01R 19/165* (2006.01)

(52) U.S. Cl.
CPC ............. *H05B 1/0227* (2013.01); *G01R 19/22* (2013.01); *G03G 15/2039* (2013.01); *G03G 15/80* (2013.01); *G01R 19/16547* (2013.01)

(58) Field of Classification Search
CPC .. H05B 1/0202; H05B 1/0227; H05B 1/0241; G01R 19/22; G03G 15/80; G03G 15/2039; G03G 15/205; G03G 15/2053; G03G 15/2078; G03G 15/5004

USPC .......... 324/120, 76.11; 399/33, 37, 45, 50, 69
See application file for complete search history.

(56) References Cited

U.S. PATENT DOCUMENTS

| 2005/0117923 | A1* | 6/2005 | Sasamoto et al. ............... 399/45 |
| 2005/0123314 | A1* | 6/2005 | Satoh .............................. 399/69 |
| 2008/0267643 | A1* | 10/2008 | Takami ........................... 399/33 |
| 2011/0280596 | A1* | 11/2011 | Shimura ......................... 399/33 |
| 2011/0280597 | A1* | 11/2011 | Shimura et al. ................. 399/37 |
| 2011/0299868 | A1* | 12/2011 | Ito .................................. 399/69 |
| 2011/0305469 | A1* | 12/2011 | Fujiwara et al. ................ 399/33 |
| 2012/0000897 | A1* | 1/2012 | Shimura ....................... 219/216 |

FOREIGN PATENT DOCUMENTS

| JP | 2000-236662 A | 8/2000 |
| JP | 2009-268324 A | 11/2009 |

* cited by examiner

*Primary Examiner* — Huy Q Phan
*Assistant Examiner* — David Frederiksen
(74) *Attorney, Agent, or Firm* — Nutter McClennen & Fish LLP; John J. Penny, Jr.

(57) ABSTRACT

When a partial pressure exceeding a Zener voltage of a Zener diode is applied to a first limiting circuit by a positive voltage applied to input terminals by an AC power supply, the first limiting circuit allows a current such that a photo transistor of the first detection circuit is turned on. When a partial pressure exceeding a total value of Zener voltages of Zener diodes is applied to a second limiting circuit by a negative voltage applied to the input terminals, the second limiting circuit allows a current such that a photo transistor of a second detection circuit is turned on. Therefore, it is possible to detect a voltage input from the AC power supply by turning on and off the photo transistors and to detect a voltage input from the AC power supply using a simpler circuit configuration.

20 Claims, 6 Drawing Sheets

AC VOLTAGE DETECTION CIRCUIT, HEATER CONTROL DEVICE AND IMAGE FORMING DEVICE

BACKGROUND

1. Technical Field

The present invention relates to an AC voltage detection circuit, a heater control device and an imaging forming device.

2. Related Art

In the related art, a circuit that detects a voltage input from a power supply has been known. For example, JP-A-2009-268324 discloses a power supply circuit including a transformer that transforms a voltage input from an AC power supply, and a photocoupler that detects the transformed voltage. In addition, JP-A-2000-236662 discloses a power supply circuit including a transformer that transforms a voltage input from an AC power supply, and a voltage detection circuit that detects the transformed voltage.

Herein, devices of JP-A-2009-268324 and JP-A-2000-236662 disclose the detection of the voltage transformed by the transformer. However, there are problems in that an overall size of the circuit and manufacturing cost increase due to the transformer. In addition, there is a need to detect the voltage without making a circuit configuration complicated preferably in the voltage detection circuit regardless of a presence or absence of the transformer.

SUMMARY

An advantage of some aspects of the invention is to detect a voltage input from an AC power supply using a simpler circuit configuration.

The invention has adopted the following means to achieve advantage described above.

According to an aspect of the invention, there is provided an AC voltage detection circuit that detects a voltage input from an AC power supply including a pair of input terminals to which a voltage is applied from the AC power supply; a limiting circuit that allows a current when a positive voltage applied to the input terminals exceeds a predetermined first threshold value, and allows a current when an absolute value of a negative voltage applied to the input terminals exceeds a predetermined second threshold value different from the first threshold value; a first detection circuit that detects that the positive voltage is applied to the input terminals and thus the limiting circuit allows the current; and a second detection circuit that detects that the negative voltage is applied to the input terminals and thus the limiting circuit allows the circuit.

In the AC voltage detection circuit of the aspect of the invention, when the positive voltage applied to the pair of input terminals by the AC power supply exceeds the first threshold value and thus the limiting circuit allows the current, the first detection circuit detects the allowance of the current. In addition, when the absolute value of the negative voltage applied to the pair of input terminals by the AC power supply exceeds the second threshold value and thus the limiting circuit allows the current, the second detection circuit detects the allowance of the current. Then, the first threshold value and the second threshold value become different from each other. That is, when the voltage applied from the AC power supply is set to positive and negative, the limiting circuit allows the current using different threshold values such as the first threshold value and the second threshold value, and thus the first and second detection circuits detect the allowance of the current. Therefore, when the voltage input from the AC power supply exceeds both the first threshold value and the second threshold value, exceeds only one of the first threshold value and the second threshold value and does not exceed both the first threshold value and the second threshold value, it changes whether the limiting circuit allows the current and the detection results of the first and second detection circuits also change. Therefore, it is possible to detect the voltage input from the AC power supply. For example, if the second threshold value is greater than the first threshold value, when both the first detection circuit and the second detection circuit detect the allowance of the current by the limiting circuit, the voltage input from the AC power supply exceeds the second threshold value. That is, a peak voltage of the AC power supply is greater than the second threshold value. When the first detection circuit detects the allowance of the current by the limiting circuit, but the second detection circuit does not detect the allowance of the current by the limiting circuit, the voltage input from the AC power supply exceeds the first threshold value, but does not exceed the second threshold value. That is, the peak voltage of the AC power supply is greater than the first threshold value and is the second threshold value or less. When both the first detection circuit and the second detection circuit do not detect the allowance of the current by the limiting circuit, the voltage input from the AC power supply does not exceed the first threshold. That is, the peak voltage of the AC power supply is the first threshold value or less. As described above, the limiting circuit, and the first detection circuit and the second detection circuit are used, and thereby it is possible to detect the voltage input from the AC power supply using a simpler configuration.

In the AC voltage detection circuit, the limiting circuit may be a circuit including a first limiting circuit that is connected across the pair of input terminals to allow a current when the positive voltage applied to the first limiting circuit exceeds a predetermined first voltage, and a second limiting circuit that is connected in series with the first limiting circuit between the pair of input terminals to allow a current when an absolute value of the negative voltage applied to the second limiting circuit exceeds a predetermined second voltage different from the first voltage, the first threshold value may be a voltage across the input terminals when a positive partial pressure applied to the first limiting circuit is set to the first voltage $V1$, the second threshold value may be an absolute value of a voltage across the input terminals when an absolute value of a negative partial pressure applied to the second limiting circuit is set to the second voltage $V2$, the first detection circuit may be a circuit that detects that the positive voltage is applied to the first limiting circuit and thus the first limiting circuit allows the current and, the second detection circuit may be a circuit that detects that the negative voltage is applied to the second limiting circuit and thus the second limiting circuit allows the current.

In the AC voltage circuit including the first limiting circuit and the second limiting circuit described above, the first limiting circuit may be a circuit that has a Zener diode of which a cathode is connected to a high potential side and of which an anode is connected to a low potential side when the positive voltage is applied to the input terminals, and in which the first voltage is a value based on a Zener voltage of the Zener diode, and the second limiting circuit may be a circuit that has a Zener diode of which a cathode is connected to the high potential side and of which an anode is connected to the low potential side when the negative voltage is applied to the input terminals, and in which the second voltage is a value based on a Zener voltage of the Zener diode. Therefore, the Zener diode is used to detect the voltage input from the AC power supply using a simpler circuit configuration. In this case, the first limiting circuit may be a circuit having a single Zener diode, and in this case, the first voltage may be the Zener voltage of the Zener diode of the first limiting circuit. In addition, the first limiting circuit may be a circuit to which a plurality of the Zener diodes are connected in series, and in this case, the first voltage may be a total value of the Zener voltages of the serially connected Zener diodes connected in series. Similarly, the second limiting circuit may be a circuit having the a single Zener diode, and in this case, the second voltage may be the Zener voltage of the Zener diode of the second limiting circuit. In addition, the second limiting circuit may be a circuit to which a plurality of the Zener diodes are connected in series, and in this case, the second voltage may be a total value of the Zener voltages of the Zener diodes connected in series.

In the AC voltage detection circuit, the first detection circuit may be a circuit that is connected in series with the limiting circuit across the pair of input terminals, and that detects that the positive voltage is applied to the input terminals and thus the limiting circuit allows the current based on a current flowing through the first detection circuit, and the second detection circuit may be a circuit that is connected in series with the limiting circuit across the pair of input terminals, and that detects that the negative voltage is applied to the input terminals and thus the limiting circuit allows the current based on the current flowing through the second detection circuit. As described above, the first and second detection circuits are connected in series with the limiting circuits so that the current allowed by the limiting circuit flows through the first and second detection circuits, and thus it is possible to easily detect whether the limiting circuit allows the current or not.

In the AC detection voltage circuit, in which the first detection and the second detection circuit are connected in series with the limiting circuit, the first detection circuit and the second detection circuit may be connected in parallel with each other and, the limiting circuit may be connected to the input terminal side from a parallel branch point when viewed from the first detection circuit and the second detection circuit. In the AC detection voltage circuit, the first detection circuit may include a photocoupler having a phototransistor and a light emitting diode of which an anode is connected to the high potential side and of which a cathode is connected to the low potential side when the positive voltage is applied to the input terminals, and the second detection circuit may include a photocoupler having a phototransistor and a light emitting diode of which an anode is connected to the high potential side and of which a cathode is connected to the low potential side when the negative voltage is applied to the input terminals. Therefore, it is possible to easily detect whether the limiting circuit allows the current by turning on and off the phototransistor. In addition, since the first detection circuit and the second detection circuit are connected in parallel with each other, and the light emitting diode of the first detection circuit and the light emitting diode of the second detection circuit are connected to each other in the opposite direction, even if the voltage applied from the AC power supply is either positive or negative, the voltages applied to the light emitting diodes of the first detection circuit and the second detection circuit are suppressed to the extent of the forward voltage of the light emitting diode. Therefore, it is possible to prevent an overvoltage from being applied to the light emitting diode. Furthermore, since the phototransistor and the light emitting diode to which the voltage is applied from the AC power supply are insulated from each other, for example, circuits connected to the phototransistor, such as the circuit using the detection results of the first detection circuit and the second detection circuit may be insulated from the AC power supply.

In the AC detection voltage circuit in which the first detection circuit and the second detection circuit are connected in parallel with each other, the AC detection voltage circuit further may include a limiting resistor that is connected in series with the limiting circuit across the pair of input terminals and that is connected to the input terminal side from the parallel branch point when viewed the first detection circuit and the second detection circuit. In this case, it is possible to suppress the current flowing through the limiting circuit, or the first and second detection circuits to be small and to prevent the overvoltage. In addition, since the limiting resistor is connected to the input terminal side from the parallel branch point when viewed from the first protection circuit and the second detection circuit, the resistor can be shared compared to the case in which the resistors are connected in series with the first detection circuit and the second detection circuit, respectively. In this case, when the positive voltage is applied to the limiting resistor from the AC power supply, the limiting resistor may be connected to the high potential side of the limiting circuit, and may be connected to the low potential side.

The AC voltage detection circuit may further include a limiting resistor connected in series with the limiting circuit across the pair of input terminals. Therefore, it is possible to suppress the current flowing through the limiting circuit by the voltage from the AC power supply to be small, and to prevent the overvoltage. In this case, when the positive voltage is applied from the AC power supply, the limiting resistor may be connected to the high potential side of the limiting circuit, and may be connected to the low potential side.

According to another aspect of the invention, there is provided a heater control device that controls a heater operated by an electrical power supplied from an AC power supply, the heater control device includes the AC voltage detection circuit according to any one of aspects, and a control section that controls a power consumption of the heater based on a presence or an absence of the detection in the first detection circuit and the second detection circuit.

The heater control device of the aspect of the invention includes the AC voltage detection circuit in any one aspect described above, and thereby can provide effects similar to those of the AC power detection circuit of the aspect of the invention described above, such as an effect capable of detecting the voltage input from the AC power supply using a simpler circuit configuration. In addition, since the power consumption is controlled based on a presence or an absence of the first detection circuit and the second detection circuit, it is possible to detect a state of the voltage input from the AC power supply, and to perform the control of the heater according to each state. Herein, "the power consumption of the heater is controlled" is to control at least one from among the voltage value, the current value and resistor value of the heater. In addition, the control of the resistor value of the heater for example, may be performed in such a manner that the heater may be made of a plurality of loads, a plurality of loads may be switched in series or in parallel, and the switching as to whether or not to flow current to any one of the plurality of loads may be performed. In addition, when the limiting circuit allows the current with respect to only any one of the positive voltage and the negative voltage, and when the limiting circuit allows the current with respect to any one of the positive voltage and the negative voltage based on the presence or absence of the detection in the first detection circuit and the second detection circuit, the control section may be a section for controlling the heater so as to suppress a change in the power consumption.

According to still another aspect of the invention, an image forming device includes a heater control device according to the aspect; a head that discharges a liquid to form an image on a medium; and a heater that is operated by an electrical power supplied from the AC power supply, of which a power consumption is controlled by the heater control device and by which the medium is heated to dry the liquid discharged onto the medium.

The image forming device of the aspect of the invention includes the above-described heater control device of the aspect of the invention, and thereby obtains an effect similar to the heater control device described above, for example, an effect capable of detecting the voltage input from the AC power supply using the simpler circuit configuration, and an effect capable of detecting states of the voltage input from the AC power supply and controlling the heater according each of the states.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
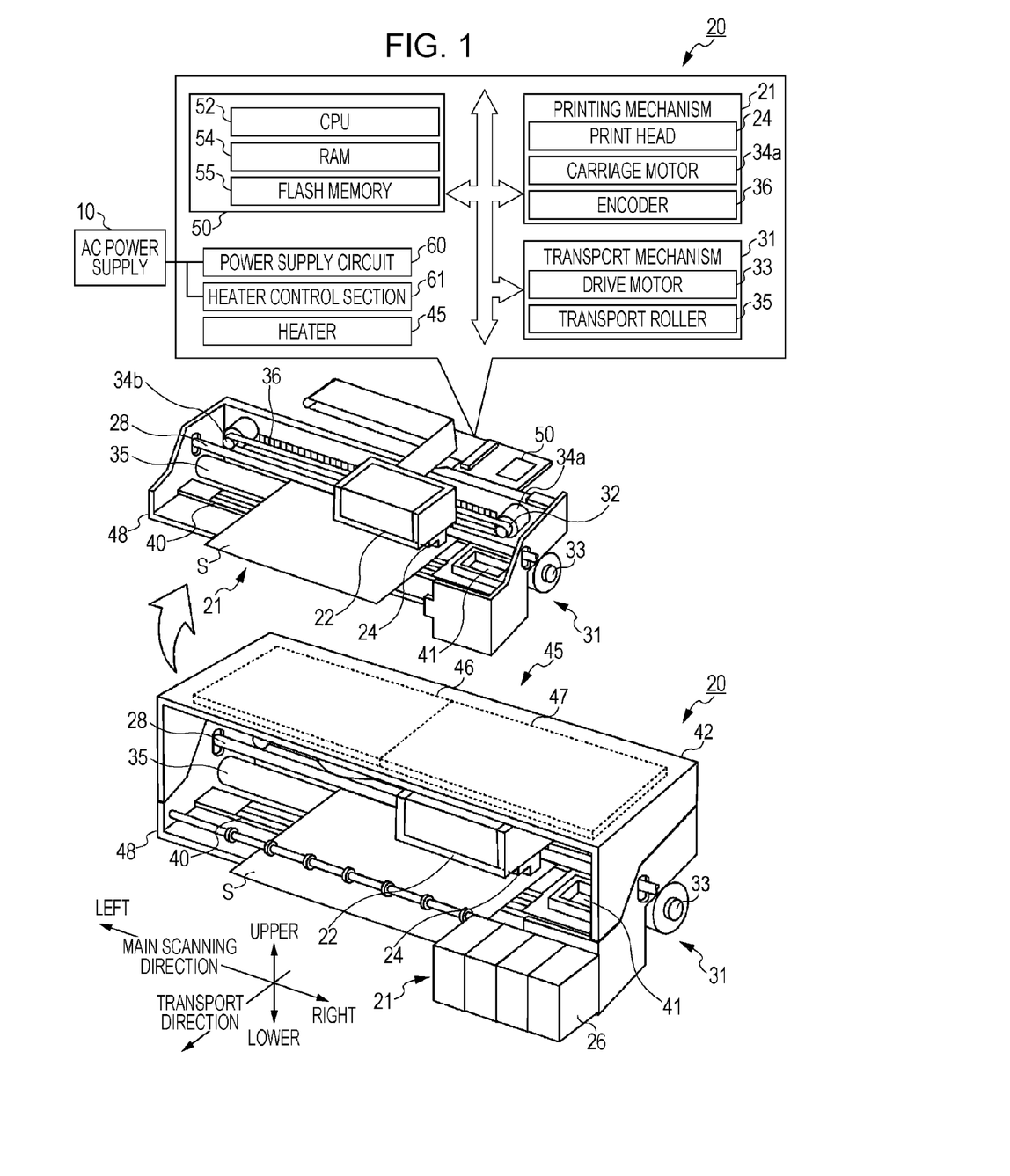
FIG. 1 is a configuration view schematically illustrating a configuration of a printer according to an embodiment of the invention.

The embodiment of the present invention will be described with reference to the drawings. FIG. 1 is a configuration view schematically illustrating a configuration of a printer 20 according to an embodiment of the invention. FIG. 1 also illustrates a configuration obtained by removing a cover 42 and a heater 45. The printer 20 of the present embodiment is configured as an ink jet printer, and as illustrated in FIG. 1, which includes a print mechanism 21 that discharges an ink as a fluid from a print head 24 on a print medium S (for example, a medium paper) transported on a platen 40 to perform a print, and a transport mechanism 31 that transports the print medium S in the transport direction (the front of the drawings) such that a transport roller 35 is driven by a drive motor 33 for the print medium S to pass through the platen 40. In addition, the printer 20 includes a capping device 41 that is formed at the right end of the platen 40 in the drawings to seal the print head 24, a heater 45 that is attached to a back surface of a cover 42 covering a print mechanism 21 to heat the print medium S, a controller 50 that controls the overall printer 20, a power supply circuit 60 that is connected to an AC power supply 10 (for example, commercial power source) to supply power to each section of the printer 20, and a heater control section 61 that is connected to the AC power supply 10 to control the heater 45. The printer 20 is configured as an image forming device that forms an image by performing printing on the print medium S using the heated and dried ink by the heater 45.

The print mechanism 21 includes a carriage 22 that is reciprocated by a carriage belt 32 in a main scanning direction (left and right) along a guide 28 according to a drive of a carriage motor 34a, the print head 24 that discharges an ink droplet onto the print medium S passing through the platen 40 to form the image, and an ink cartridge 26 that individually accommodates the ink of each color to supply the ink to the print head 24. By the carriage motor 34a disposed on the right side of a mechanical frame 48, a driven roller 34b disposed on the left side of the mechanical frame 48, and the carriage belt 32 installed in the carriage motor 34a and the driven roller 34b, the carriage 22 moves in a main scanning direction intersecting a transport direction of the printing medium S. The back surface of the carriage 22 is provided with an encoder 36 for detecting a position of the carriage 22, and the use of the encoder 26 enables a position of the carriage 22 to be managed.

The print head 24 is disposed on a lower surface of the carriage 22, and discharges the ink of each color from a nozzle disposed in a lower surface of the print head 24 in the manner of pressurizing the ink by applying voltage to the piezoelectric element to deform the piezoelectric element. The print head 24 may adopt the manner that pressurizes the ink by bubbles generated by applying the voltage to a heating resistor and heating the ink. The ink cartridge 26 is disposed in the mechanism frame 48 individually accommodates the ink of each of colors such as yellow (Y), magenta (M), cyan (C) and black (K) containing dye or pigment as a colorant in water as solvent.

The platen 40 is a member that transports a lower side of the print head 24, and supports the print medium S heated by the heater 45, which is formed along the main scanning direction of the print head 24 so as to be opposite to the print head 24 moving along the guide 28.

The heater 45 is disposed on an upper side of the carriage 22 and the platen 40, and includes a first load 46 disposed on the right side in the main scanning direction 46, and a second load 47 disposed on the left side in the main scanning direction. Therefore, the first load 46 and the second load 47 are heated by a resistance heating method, by which the heater 45 heats the print medium S passing through the platen 40, thereby drying the ink discharged on the print medium S. The heater 45 has a longer length than the print medium S in the main scanning direction and thus substantially heats the whole print medium in the main scanning direction. Although described later in detail, the heater 45 is operated by the AC power supplied by the AC power supply 10, and the power consumption of the heater is controlled by a heater control section 61.

The power supply circuit 60 is a circuit that is connected to the AC power supply 10, and supplies a power supplied from the AC power supply 10 to each section of the printer 20. The power supply circuit 60 enables an AC-DC converter (not shown) to convert an AC power supplied from the AC power supply 10 into a DC power, and thus supplies the DC power to each section of the printer 20 such as the print mechanism 21, a transport mechanism 31, a controller 50 and the heater control section 61. The power supply circuit 60 supplies a DC power such as DC 20 V and DC 5 V according to an operating voltage of a supplier. The power supply circuit 60 serves as DC power source Vcc supplying DC 5 V with respect to the heater control section 61. In addition, the DC power supply Vcc may be several V degrees such as DC 3.3 V and is not limited to a DC 5 V.

Figure 2:
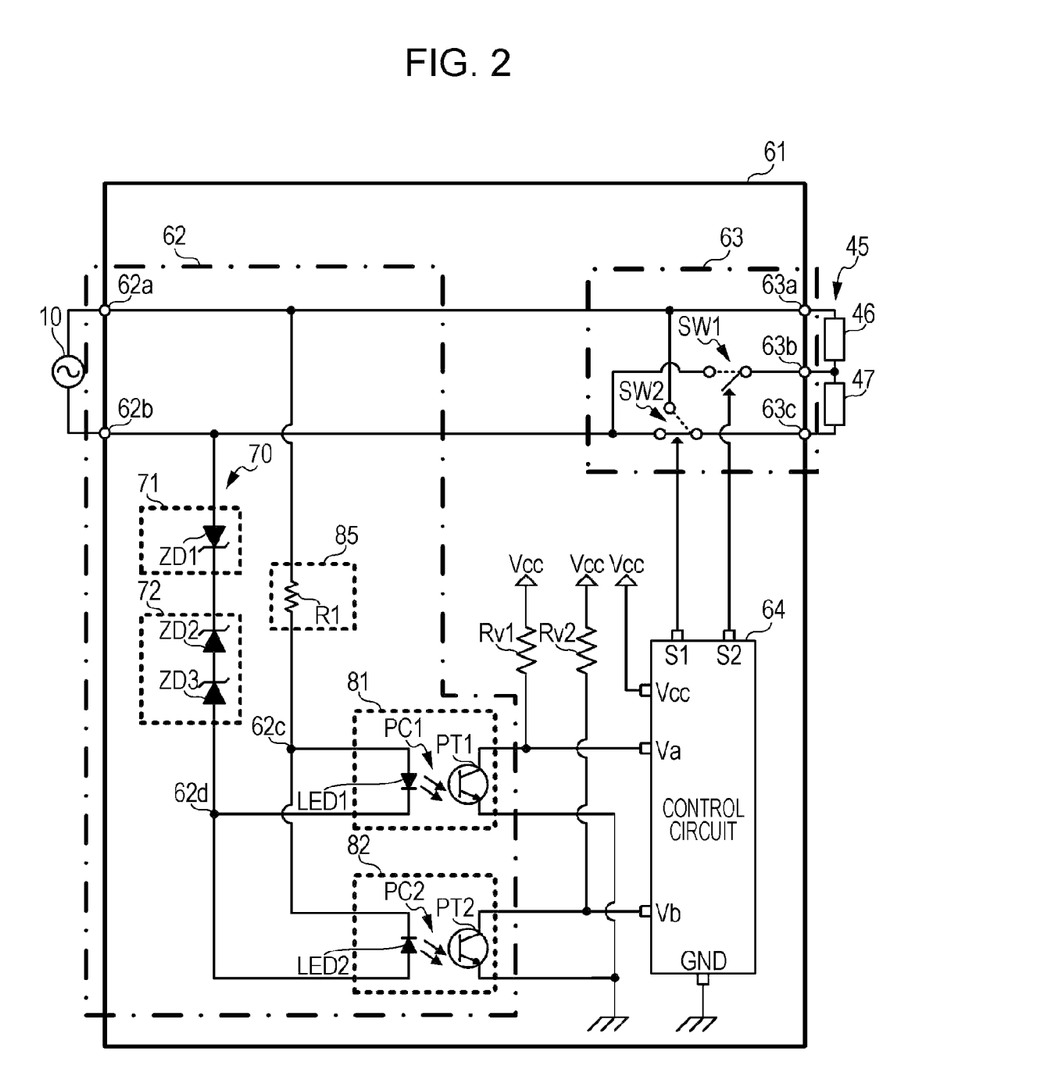
FIG. 2 is a circuit diagram of a heater control section.

The heater control section 61 is connected to the AC power supply 10 to supply the AC power supplied from the AC power supply 10 to the heater 45, and controls the power consumption of the heater 45. FIG. 2 is a circuit diagram of a heater control section 61. As illustrated in the drawing, the heater control section 61 includes an AC voltage detection circuit 62 that detects the voltage input from the AC power supply 10, a voltage switching circuit 63 that switches an electrical path when the AC power supplied from the AC power supply 10 is supplied to the heater 45, and a control circuit 64 that switches the electrical path of the voltage switching circuit 63 based on the detection result of the AC voltage detection circuit 62.

The AC voltage detection circuit 62 includes a pair of input terminals 62a, 62b, a limiting circuit 70, a first detection circuit 81, a second detection circuit 82 and a limiting resistor 85. The input terminals 62a and 62b are connected to the AC power supply 10, and receive the voltage from the AC power supply 10. A limiting resistor 85, the first detection circuit 81 and the second detection circuit 82, and the limiting circuit 70 are serially connected across the input terminal 62a and the input terminal 62b. In addition, there is a branch point 62c in the electrical path connected to the limiting resistor 85, and the first detection circuit 81 and the second detection circuit 82, there is a branch point 62d in the electrical path connected to the limiting circuit 70, and the first detection circuit 81 and the second detection circuit 82, and the first detection circuit 81 and the second detection circuit 82 are connected in parallel with each other. The limiting circuit 70 is connected to the input terminal 62b side (AC power supply 10 side) rather than the branch point 62d when viewed from the first detection circuit 81 and the second detection circuit 82. The limiting resistor 85 is connected to the input terminal 62a side (AC power supply 10 side) rather than the branch point 62c when viewed from the first detection circuit 81 and the second detection circuit 82. In addition, in the following description, a positive and negative voltage of the AC power supply 10 is indicated using the potential of the input terminal 62b as a standard. That is, it is assumed that a state having a high potential of the input terminal 62a with respect to the input terminal 62b is described as a state in which the positive voltage is applied from the AC power supply 10, and a state having a low potential of the input terminal 62a with respect to the input terminal 62b is described as a state in which the negative voltage is applied from the AC power supply 10.

The limiting circuit 70 includes a first limiting circuit 71 having a Zener diode ZD1, and a second limiting circuit 72 having a Zener diode ZD2 and a Zener diode ZD3, which are connected in series with each other. In the Zener diode ZD1 of the limiting circuit 71, an anode thereof is connected to the input terminal 62b, and the cathode thereof is connected to a cathode of the Zener diode ZD2. In the Zener diode ZD2 of the second limiting circuit 72, an anode thereof is connected to a cathode of the Zener diode ZD3, and the cathode thereof is connected to a cathode of the Zener diode ZD1. In the Zener diode ZD3, an anode thereof is connected to the branch point 62d, and the cathode thereof is connected the Zener diode ZD2. In the Zener diodes ZD1 to ZD3, Zener voltages VZ1 to VZ3 (a breakdown voltage) thereof are for example, several tens to several hundreds of volts, and forward voltages VF1 to VF3 are for example, several tens of volts. In the embodiment, it is assumed that all the Zener diodes ZD1 to ZD3 are the same element, all the Zener voltage VZ1 to VZ3 are 120V and all the forward voltages VF1 to VF3 are 2 V.

In the limiting circuit 70, when the positive voltage is applied to the input terminals 62a and 62b from the AC power supply 10, the Zener diode ZD1 of the first limiting circuit 71 has the cathode connected to the high potential side (the input terminal 62a side), and the anode connected to the low potential side (the input terminal 62b side). Therefore, if the Zener voltage VZ1 of the Zener diode ZD1 is set to a first voltage V1, when the positive voltage (a reverse bias with respect to the Zener diode ZD1) applied to the first limiting circuit 71 by the AC power supply 10 is the first voltage V1 or less, the first limiting circuit 71 does not allow the Zener diode ZD1 to conduct and thus the current hardly flows therethrough. On the other hand, when the positive voltage applied to the limiting circuit 71 by the AC power supply 10 exceeds the first voltage V1, the first limiting circuit allows the Zener diode ZD1 to conduct, so that the current flow therethrough. In addition, when the absolute value of the negative value (a forward bias with respect to the Zener diode ZD1) applied to the first limiting circuit 71 by the AC power supply 10 is the forward voltage VF1 of the Zener diode ZD1 or less, the limiting circuit 71 does not allow the Zener diode ZD1 to conduct and thus the current hardly flows therethrough. Furthermore, when the absolute value of the negative value applied to the first limiting circuit 71 by the AC power supply 10 exceeds the forward voltage VF1, the first limiting circuit 71 allows the Zener diode ZD1 to conduct, so that the current flows therethrough. In addition, when the negative voltage is applied to the input terminals 62a and 62b from the AC power supply 10, the cathodes in the Zener diodes ZD2 and ZD3 of the second limiting circuit 72 are connected to the high potential side (the input terminal 62b side) and the anode thereof is connected to the low potential side (the input terminal 62a side). Therefore, if a total value of the Zener voltage VZ2 and VZ3 of the Zener diodes ZD2 and ZD3 is set to the second voltage V2, when the absolute value of the negative voltage (a reverse bias with respect to the Zener diodes ZD2 and ZD3) applied to the second limiting circuit 72 by the AC power supply 10 is the second voltage or less, the second limiting circuit 72 does not allow the Zener diodes ZD2 and ZD3 to conduct, so that the current hardly flows therethrough. Meanwhile, when the absolute value of the negative voltage applied to the second limiting circuit 72 by the AC power supply 10 exceeds the second voltage V2, the second limiting circuit allows the Zener diodes ZD2 and ZD3 to conduct, and thus the current flows therethrough. In addition, when the positive voltage (a forward bias with respect to the Zener diodes ZD2 and ZD3) applied to the second limiting circuit 72 by the AC power supply 10 is the total value of the forward voltages VF2 and VF3 of Zener diode ZD2 and ZD3 or less, the second limiting circuit 72 does not allow the Zener diodes ZD2 and ZD3 to conduct, and thus the current hardly flows therethrough. Meanwhile, when the positive voltage applied to the second limiting circuit 72 by the AC power supply 10 exceeds the total value of the VF2 and VF3, the second limiting circuit 72 allows the Zener diodes ZD2 and ZD3 to conduct, and thus the current flows therethrough.

The first detection circuit 81 includes a photocoupler PC1 having a light emitting diode LED1 and a phototransistor PT1. When the positive voltage is applied to the input terminals 62a and 62b from the AC power supply 10, the light emitting diode LED1 has an anode connected to the high potential side (the branch point 62c side), and a cathode connected to the low potential side (a branch point 62d side). In the phototransistor PT1, a collector thereof is connected to a DC power source Vcc via a pull-up resistor Rv1 and is connected to a Va terminal 64 of the control circuit 64 as described below, and an emitter thereof is connected to a ground. In the first detection circuit 81, when the first limiting circuit 71 allows the current using the positive voltage applied from the AC power supply 10 and thus the forward current flows into the light emitting diode LED1, the light emitting diode LED1 is emitted and thus the phototransistor PT1 receives the emission and thus the phototransistor PT1 is turned on. On the other hand, when the first limiting circuit 71 does not allow the current even if the positive voltage is applied from the AC power supply, or the negative voltage is applied from the AC power supply 10, the light emitting diode LED1 is not allowed for the forward current to flow, and thus is not emitted. Therefore, the phototransistor PT1 is turned off. As described above, the first detection circuit 81 is a circuit that detects that the first limiting circuit 71 allows the current by the positive voltage applied from AC power supply 10 by turning on or off the phototransistor PT1. In addition, the forward voltage VF4 of the light emitting diode LED1, for example is several volts Vs, and thus in the embodiment, it is assumed that the forward voltage VF4 is 2 V. Further, a resistance value of the pull-up resistor Rv1 is set to an appropriate value (1 kΩ) such that the collector current of the phototransistor PT1 flowing by turning on the phototransistor is limited to the threshold value or less.

The second detection circuit 82 includes a photocoupler PC2 having a light emitting diode LED2 and a phototransistor PT2. When the negative voltage is applied from the AC power supply 10, the light emitting diode LED2 has an anode connected to the high potential side (the branch point 62d side), and a cathode connected to the low potential side (a branch point 62c side). In the phototransistor PT2, a collector thereof is connected to a DC power source Vcc via a pull-up resistor Rv2 and is connected to a Vb terminal Vb of the control circuit 64 as described below, and an emitter thereof is connected to a ground. In the second detection circuit 82, when the second limiting circuit 72 allows the current using the negative voltage applied from the AC power supply 10 and thus the forward current flows into the light emitting diode LED2, the light emitting diode LED2 is emitted and thus the phototransistor PT2 receives the emission and thus the phototransistor PT2 is turned on. On the other hand, when the second limiting circuit 72 does not allow the current even if the negative voltage is applied from the AC power supply 10, or the positive voltage is applied from the AC power supply 10, the light emitting diode LED2 is not allowed for the forward current to flow, and thus is not emitted. Therefore, the phototransistor PT2 is turned off. As described above, the second detection circuit 82 is a circuit that detects that the second limiting circuit 72 allows the current by the negative voltage applied from AC power supply 10 by turning on or off the phototransistor PT2. In addition, the forward voltage VF5 of the light emitting diode LED2 for example, is several volts Vs, and thus in the embodiment, it is assumed that the forward voltage VF4 is 2 V. Furthermore, a resistance value of the pull-up resistor Rv2 is set to an appropriate value (1 kΩ) such that the collector current of the phototransistor PT2 flowing by turning on the phototransistor PT2 is limited to the threshold value or less.

The limiting resistor 85 is connected in series with the limiting circuit 70 across a pair of input terminals 62a and 62b, and includes a resistor R1 connected to the input terminal 62a side (the AC power supply 10 side) rather than the branch point 62c when viewed from the first detection circuit 81 and the second detection circuit 82. The limiting resistor 85 is to limit the current flowing into the limiting circuit 70 or the first detection circuit 81 and the second detection circuit 82 by the AC power from the AC power supply 10. A resistance value of the resistor R1 is set to an appropriate value (for example, several kΩ) such that the current flowing when the limiting circuit 70 allows the current by the voltage from the AC power supply 10 is limited to a predetermined value (several mA or less). In the embodiment, it is assumed that the resistor R1 is 5 kΩ.

A voltage switching circuit 63 includes output terminals 63a to 63c that are connected to the heater 45 to output the power, a switch SW1 that switches a presence or absence of the conduction across the input terminal 62b and the output terminal 63b, and a switch SW2 that performs the switching as to whether the output terminal 63c conducts the input terminal 62a and an output terminal 63a or conducts the input terminal 62b. A first load 46 of the heater 45 is connected across the output terminals 63a and 63b. In addition, a second load 47 of the heater 45 is connected across the output terminals 63b and 63c. The switching of the switches SW1 and SW2 is performed by a signal (voltage) from an S1 terminal and an S2 terminal to be described later of the control circuit 64. The voltage switching circuit 63 allows switching whether to connect the first load 46 and the second load 47 in series or in parallel with each other by switching the switches SW1 and SW2. In details, when both the switches SW1 and SW2 are in a state illustrated by the solid line in FIG. 2, that is, when the switch SW1 does not allow the conduction across the input terminal 62b and the output terminal 63b, and the switch SW2 allows the conduction across the output terminal 63c and the input terminal 62b, the first load 46 and the second load 47 are connected in series with each other. In this state, the voltage across the input terminals 62a and 62b is applied across the output terminals 63a and 63c. In addition, when both the switches SW1 and SW2 are in a state illustrated by the wavy line in FIG. 2, that is, when the switch SW1 allows the conduction across the input terminal 62b and the output terminal 63b, and the switch SW2 allows the conduction across the output terminal 63c, and the input terminal 62b and the output terminal 63a, the first load 46 and the second load 47 are connected in series with each other, the first load 46 and the second load 47 are connected in parallel with each other. In this state, the voltage across the input terminals 62a and 62b is applied across the output terminals 63a and 63b, and is applied across the output terminals 63c and 63b. In addition, when the switch SW1 is in a state which is illustrated by the solid line in FIG. 2, and the switch SW2 is in a state which is illustrated by the wavy line, an electrical path is opened and thereby the first load 46 and the second load 47 become a state in which the current does not flow to the first load 46 and the second load 47, that is, a state in which the heater 45 is turned off.

The control circuit 64 is configured as an IC chip to control the power consumption of the heater 45 by switching the switches SW1 and SW2 of the voltage switching circuit 63 based on a presence or an absence of the detection in the first detection circuit 81 and the second detection circuit 82. The control circuit 64 includes a Vcc terminal to which the DC power source Vcc is input, a Va terminal that is connected to the DC power source Vcc via the pull-up resistor Rv1, and that is connected to the collector of the phototransistor PT1, a Vb terminal that is connected to the DC power source Vcc via the pull-up resistor Rv2, and that is connected to a collector of the phototransistor PT2, an S1 terminal and an S2 terminal that output a signal to the switches SW1 and SW2 of the voltage switching circuit 63, and a GND terminal that is connected to the ground. The Vcc terminal and the GND terminal are an input terminal of a control voltage of the control circuit 64, and the control circuit 64 is operated by the voltage from the DC power source Vcc applied across the Vcc terminal and the GND terminal. The Va terminal is the same potential as the ground, that is, becomes low when the phototransistor PT1 of the first detection circuit 81 is turned on, and is the same potential as the DC power source Vcc, that is, becomes high when the phototransistor PT1 is turned on. The vb terminal is the same potential as the ground, that is, becomes low when the phototransistor PT2 of the second detection circuit 82 is turned on, and is the same potential as the DC power source Vcc, that is, becomes high when the phototransistor PT2 is turned off. The control circuit 64 determines whether or not the Va terminal and the Vb terminal become low during a predetermined period longer than a period (for example, 1/60 sec, 1/50 sec and the like) of the AC power supply 10, and repeats processes that output signals from the S1 terminal and the S2 terminal based on the determination results. Specifically, when both the Va terminal and the Vb terminal become low during the predetermined period, a signal is output from the S1 terminal and the S2 terminal such that the switches SW1 and SW2 become a state of the solid line in FIG. 2 and thus the first load 46 and the second load 47 are connected in series with each other. In addition, when the Va terminal becomes low, and the Vb terminal does not become low, a signal is output from the S1 terminal and the S2 terminal such that the switch SW1 and the switch SW2 become a state as illustrated by the wavy line in FIG. 2, and thus the first load 46 and the second load 47 are connected in parallel with each other. When both the Va terminal and the Vb terminal do not become low, the signal is output from the S1 terminal and the S2 terminal such that the switch SW1 becomes a state illustrated by the solid line in FIG. 2, and the switch SW2 becomes a state illustrated by the wavy line, and thus the heater 45 is turned off.

A controller 50 is configured as a microprocessor centered on a CPU 52 and includes a RAM 54 that stores and saves data temporarily, and a flash memory 55 that stores various processing programs and rewrites the data. The controller 50 is connected to an interface (I/F) (not illustrated) that exchanges information with an external device such as a personal computer, and an I/O port (not illustrated) that inputs and outputs the data. The controller 50 inputs a position signal via the input port from an encoder 36. In addition, the controller 50 outputs a drive signal to a print head 24, a drive motor 33 and a carriage motor 34a via the output port.

When the printer 20 configured in this way, for example, is instructed to print an image to a recording sheet S from a user via the personal computer connected to the printer 20, the controller 50 inputs image data of a print objection from the personal computer, and stores the data to a print buffer area of the RAM 74, and then performs a print processing routine which forms the image based on the image data on the recording sheet S. The print processing routine forms the image on the print medium S in a way that repeats a process that transports the print medium S by controlling the drive motor 33 by the controller 50, and a process that prints one pass of the image data by discharging the ink from a nozzle of the print head 24 while the carriage 22 is moved by controlling the carriage motor 34a. In addition, the heater control section 61 supplies the AC power supply to the heater 45, and thus the first load 46 and the second load 47 are heated. Accordingly, the print medium S is heated by the first load and the second load and thereby the ink discharged on the print medium S is dried.

An operation of the heater control section 61 will be described below. First, when the positive voltage is applied across input terminals 62a and 62b, that is, when the voltage V across the input terminals 62a and 62b>0 is established, an operation of AC power detection circuit 62 will be described. In order that a partial pressure of the first limiting circuit 71 exceeds the first voltage V1 and thus the first limiting circuit 71 allows the current, it is necessary that all of the Zener diodes ZD2 and ZD3 which are connected in series with the first limiting circuit 71 and the light emitting diode LED1 conduct, and the partial pressure of the first limiting circuit 71 exceeds the first voltage V1. Therefore, when the voltage V across the input terminals 62a and 62b exceeds a first threshold value Vth1 represented by the following equation (1) using the Zener voltage VZ1 of the Zener diode ZD1, the forward voltages VF2 and VF3 of the Zener diodes ZD2 and ZD3, the forward voltage VF4 of the light emitting diode LED1, and the resistor R1, the positive partial pressure applied the first limiting circuit 71 exceeds the first voltage V1 (=VZ1), and thus the current flows into the first limiting circuit 71. Then, when the first limiting circuit 71 allows the current, the current flows into the light emitting diode LED1 and thus the phototransistor PT1 is turned on. In addition, the current I1 in the equation (1) is a minimum value (for example, several mA) of the current required for the Zener diodes ZD1 to ZD3 and the light emitting diode LED1 to conduct at the positive voltage, and R2×I1 is a value of the voltage drop across the limiting resistor 85 by the current I1. In the embodiment, the current I1 is set to 1 mA. Therefore, in the present embodiment, the first threshold value Vth1=VZ1 (120 V)+VF2 (2 V)+VF3 (2 V)+VF4 (2 V)+R1 (5 kΩ)×I1 (1 mA)=131 V. In addition, the voltage drops in the forward voltages VF2 and VF3 of the Zener diodes ZD2 and ZD3, the forward voltage VF4 of the light emitting diode LED1, and the resistor R1 all are as small as several tens of volts compared with the Zener voltage VZ1 of the Zener diode ZD1 set to the value of several tens to several hundreds of volts, and thus the value of the Zener voltage VZ1 is predominated over the first threshold value Vth1. Therefore, an element used as the Zener diode ZD1 is selected to set the Zener voltage VZ1 to an optional value, and thus it is possible to adjust the first threshold Vth1 to a predetermined value. Herein, since the light emitting diode LED1 and the light emitting diode LED2 are connected in parallel with each other, when the positive voltage exceeding the first threshold value Vth1 is applied across the input terminals 62a, and 62b, and thus the current flows, the reverse bias of the light emitting diode LED2 becomes the voltage across the branch points 62c and 62d, that is, the forward voltage VF4 of the light emitting diode LED1. Therefore, the voltage applied to the light emitting diode LED2 becomes constant regardless of the voltage V of the input terminals 62a and 62b, and prevents the overvoltage applied to the light emitting diode LED2.

$$Vth1 = VZ1 + VF2 + VF3 + VF4 + R1 \times I1 \tag{1}$$

Subsequently, when the negative voltage is applied across the input terminals 62a and 62b (a voltage V<0), an operation of the AC voltage detection circuit 62 will be described. In this case, in order for the absolute value of the partial pressure of the second limiting circuit 72 to exceed the second voltage V2, and thus for the second limiting circuit 72 to allow the current, it is necessary that the Zener diode ZD1 which is serially connected to the second limiting circuit 72, and the light emitting diode LED2 be both conducted. Therefore, when the absolute value of the voltage V across the input terminals 62a and 62b exceeds the second threshold value Vth2 represented by the following equation (2) using the Zener voltages VZ2 and VZ3 of the Zener diodes ZD2 and ZD3, the forward voltage VF1 of the Zener diode ZD1, the forward voltage VF5 of the light emitting diode LED2, and the resistor R1, the absolute value of the negative partial pressure applied to the second limiting circuit 72 exceeds the second voltage V2 (=VZ2+VZ3), and thus the current flows into the second limiting circuit 72. Then, when the second limiting circuit 72 allows the current, the current flows into the light emitting diode LED2, and thus the phototransistor PT2 is turned on. In addition, the current I2 in the equation (2) is a minimum value (for example, several mA) of the current required for the light emitting diode LED2, the Zener diodes ZD1 to ZD3 to conduct at the negative voltage, and R1×I2 is a value of the voltage drop at the limiting resistor 85 by the current I1. In the embodiment, the current I2 is set to 1 mA. Therefore, in the present embodiment, the second threshold value Vth2=VZ2 (120 V)+VZ3 (120 V)+VF1 (2 V)+VF5 (2 V)+R1 (5 kΩ)×I2 (1 mA)=249 V. In addition, the voltage drops in the forward voltage VF1 of the Zener diodes ZD1, the forward voltage VF5 of the light emitting diode LED2, and the resistor R1 all are as small as several tens of volts compared with the Zener voltages VZ2 and VZ3 of the Zener diodes ZD2 and ZD3 set to the value of several tens to several hundreds of volts, and thus the second voltage V2, that is, the values of the Zener voltages VZ2 and VZ3 are predominated over the second threshold value Vth2. Therefore, an elements used as the Zener diodes ZD2 and ZD3 are selected to set the Zener voltage VZ2 and VZ3 to an optional value, and thus it is possible to adjust the second threshold Vth2 to a predetermined value. In addition, the first threshold Vth1 and the second threshold value Vth2 are adjusted to different values. Herein, since the light emitting diode LED1 and the light emitting diode LED2 are connected to each other in parallel, when the negative voltage in which the absolute value across the input terminals 62a and 62b exceeds the second threshold value Vth2 is applied, and thus the current flows, the reverse bias of the light emitting diode LED1 becomes the voltage across the branch points 62c and 62d, that is, the forward voltage VF5 of the light emitting diode LED2. Therefore, the voltage applied to the light emitting diode LED1 becomes constant regardless of the voltage of the input terminals 62a and 62b, and prevents the overvoltage applied to the light emitting diode LED1.

$$Vth2 = VZ2 + VZ3 + VF1 + VF5 + R1 \times I2 \qquad (2)$$

As described above, in the AC voltage detection circuit 62, the limiting circuit 70 is operated as a circuit that allows the current when the positive voltage applied to the input terminals 62a and 62b exceeds the first threshold value Vth1, and allows the current when the absolute value of the negative applied to the input terminals 62a and 62b exceeds the second threshold value Vth2 different from the first threshold value Vth1. Then, when the positive voltage applied to the input terminals 62a and 62b exceeds the first threshold value Vth1, and thus the current flows into the limiting circuit 70, the phototransistor PT1 of the first detection circuit 81 is turned on to detect the allowance of the current. Similarly, when the absolute value of the negative voltage applied to the input terminals 62a and 62b exceeds the second threshold value Vth2, and thus the current flows into the limiting circuit 70, the phototransistor PT2 of the second detection circuit 82 is turned on to detect the allowance of the current.

Figure 3:
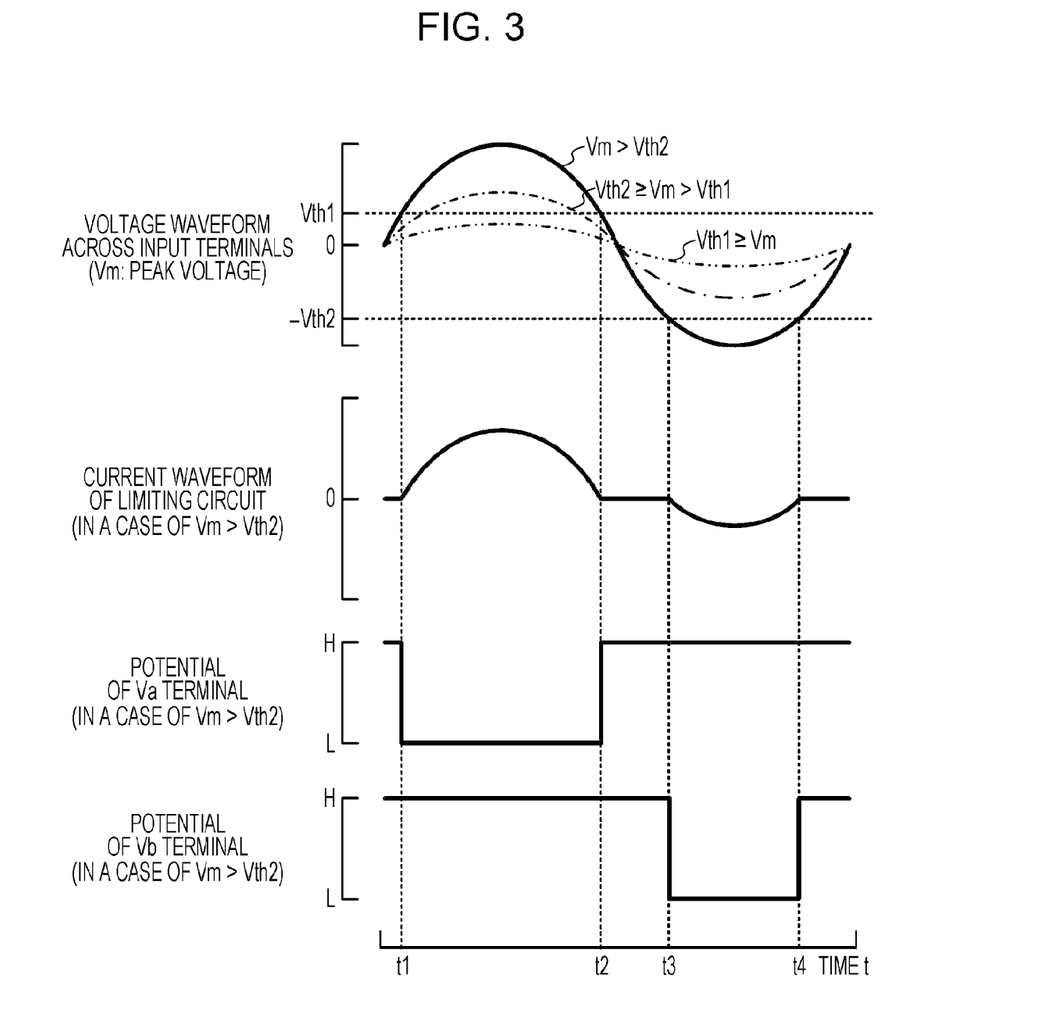
FIG. 3 is a graph when a peak voltage>a second threshold value is established.
Figure 4:
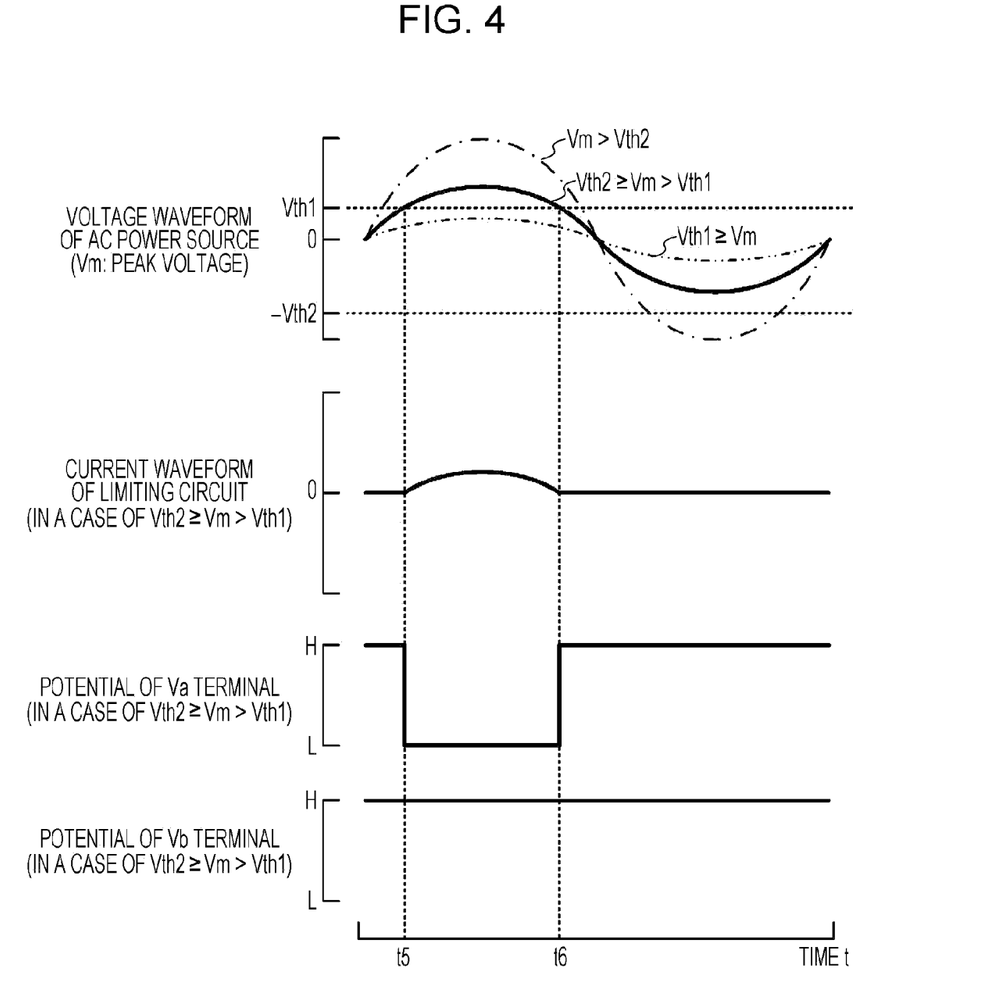
FIG. 4 is a graph when a second threshold value a peak voltage>a first threshold value is established.
Figure 5:
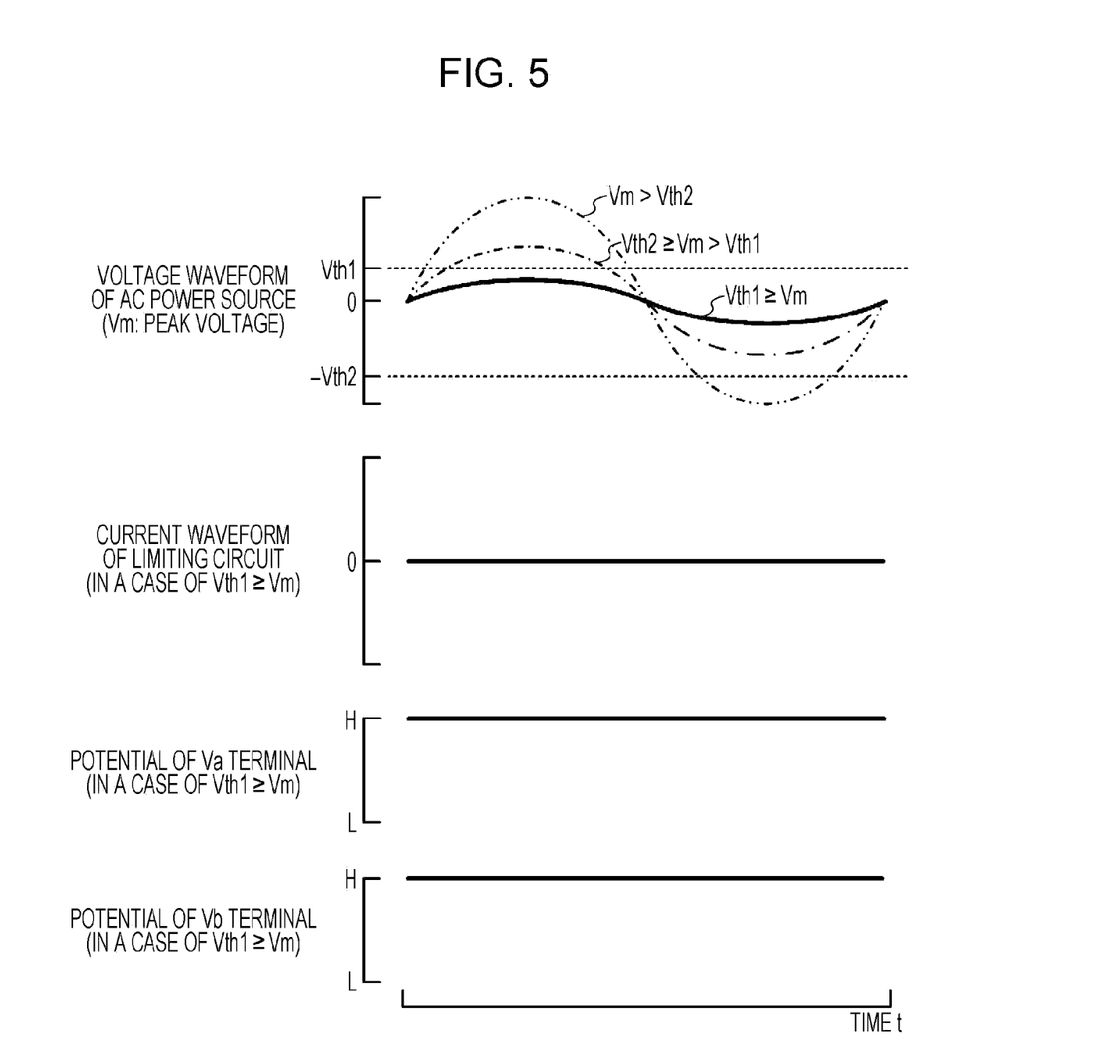
FIG. 5 is a graph when a first threshold value a peak voltage is established.

Subsequently, an operation of the entire heater control section 61 including the AC voltage detection circuit 62 will be described. FIGS. 3 to 5 are graphs illustrating a relationship between a waveform of the voltage V applied across the input terminals 62a and 62b by the AC power supply 10, a current waveform of the limiting circuit 70 and potentials of the Va terminal and the Vb terminal of the control circuit 64. FIG. 3 illustrates the case where a peak voltage Vm of the AC power supply 10>the second threshold value Vth2 is established, FIG. 4 illustrates the case where the second threshold value Vth2≥the peak voltage Vm>the first threshold value>the first threshold value Vth1 is established, and FIG. 5 illustrates the case where the first threshold value Vth1≥the peak voltage Vm is established.

First, the case when the peak voltage Vm>the second threshold value Vth2 will be described with reference to FIG. 3. If the AC power supply 10 is an AC 200V power supply (the peak voltage Vm=282 V), that is, when the peak voltage Vm exceeds the second threshold value Vth2 (>the first threshold value Vth1), as illustrated in the drawings, the positive voltage applied from the AC power supply 10 exceeds the first threshold Vth1 between the time t1 and the time t2. Therefore, the positive voltage (the partial pressure) applied to the first limiting circuit 71 exceeds a first voltage V1 and a conduction is made between the time t1 and the time t2, and thereby the limiting circuit 70 allows the current. Then, the light emitting diode LED1 of the first detection circuit 81 is emitted by the current, and thus the phototransistor PT1 is turned on. Therefore, the potential of the Va terminal becomes low between the time t1 and the time t2. On the other hand, the reverse bias is applied to the light emitting diode LED2 of the second detection circuit 82 between the time t1 and the time t2, and thus the potential of the Vb terminal is kept high. In addition, the absolute value of the negative voltage applied from the AC power supply 10 exceeds the second threshold value Vth1 between the time t3 and the time t4 (the voltage V becomes −Vth1 or less). Therefore, the absolute value of the negative voltage (partial voltage) applied to the second limiting circuit 72 exceeds the second voltage V2 between the time t3 and the time t4 and thus a conductance is made. Therefore, the limiting circuit 70 allows the current. Then, the light emitting diode LED2 of the first detection circuit 82 is emitted by the current, and thus the phototransistor PT2 is turned on. Therefore, the potential of the Vb terminal becomes low between the time t3 and the time t4. On the other hand, the reverse bias is applied to the light emitting diode LED1 of the first detection circuit 81 between the time t3 and the time t4, and thus the potential of the Va terminal is kept high. Then, both the Va terminal and the Vb terminal become low, and thus the control circuit 64 outputs a signal from the S1 terminal and the S2 terminal such that the switches SW1 and SW2 become a state illustrated by the solid line in FIG. 2. Therefore, the first load 46 and the second load 47 are connected in series with each other, and thus the first load 46 and the second load 47 generate heat by applying the voltage V across the input terminals 61a and 61b to the output terminals 61c and 61e. Therefore, when the resistance value of the first load 46 and the second load 47 of the heater 45 is set to R, the power consumption of the heater 45 is set to W=V²/2 R.

FIG. 4 illustrates a case where the second threshold Vth2≥the peak voltage Vm>the first threshold Vth1 is established. Such as when the AC power supply 10 is the AC 100 V (the peak voltage Vm=141 V) power source, that is, when the peak voltage Vm is the second threshold value Vth2 or less, but exceeds the first threshold value Vth1, the positive voltage applied from the AC power supply 10 as illustrated, exceeds the first threshold value Vth1 between the time t5 and the time t6. Therefore, in the same manner as the times t5 and t6 in FIG. 3, the limiting circuit 70 allows the current between the time 1 and time t2 in FIG. 3, and the phototransistor PT1 is turned on, and thus the potential of the Va terminal becomes low. On the other hand, the second threshold value Vth2≥the peak voltage Vm is established, and thus the absolute value of the negative value applied from the AC power supply 10 does not exceed the second threshold value Vth2. Therefore, unlike FIG. 3, when the negative voltage is applied to the AC power supply 10 from the AC power supply 10 the limiting circuit 70 does not allow the current, and the Va terminal and the Vb terminal are both kept high. Then, since the Va terminal becomes low, and the Vb terminal does not become low, the limiting circuit 64 outputs the signal from the S1 terminal and the S2 terminal such that the switches SW1 and SW2 become a state illustrated by the wavy line in FIG. 2. Therefore, the first load 46 and the second load 47 are connected in parallel with each other, and the first load 46 and the second load 47 generate heat by applying the voltage across the input terminals 62a and 62b between the output terminals 63a and 63b and between the output terminals 63c and 63b. Therefore, the power consumption of the heater 45 becomes $W=V^2/(0.5\,R)$.

Next, FIG. 5 illustrates a case where the threshold value Vth1≥the peak voltage Vm is established. When the printer 20 is not connected to the AC power supply 10, that is, when the peak voltage Vm is the first threshold value Vth1 or less, the positive voltage applied from the AC power supply 10 as illustrated, does not exceed the first threshold value Vth1, and the absolute value of the negative voltage does not exceed the second threshold value Vth2. Therefore, the limiting circuit 70 does not allow the current, and the voltages of the Va terminal and the Vb terminal are both kept high. Then, since the Va terminal and the Vb terminal are both not kept low, the limiting circuit 64 outputs the signal from the S1 terminal and the S2 terminal such that the switch SW1 becomes a state represented by the solid line in FIG. 2, and the switch SW2 becomes a state represented by the wavy line in FIG. 2. Therefore, the electrical path is opened, and thus the first load 46 and the second load 47 become a state in which the current does not flow, that is, the heater 45 becomes an OFF state.

According to the operation of the heater control section 61 as described above, when the peak voltage Vm exceeds the second threshold value Vth2, the power consumption of the heater 45 is set to $W=V^2/(2\,R)$, and the voltage Vm exceeds the first threshold value Vth1, but is the second threshold value Vth2 or less, the power consumption of the heater 45 is set to $W=V^2/(0.5\,R)$. Therefore, when the peak voltage Vm exceeds the first threshold Vth1, but is the second threshold value Vth2 or less, the voltage V across the input terminals 62a and 62b decreases compared with when the peak voltage Vm exceeds the second threshold value Vth2, but in this case, the resistance value of the heater 45 decreases, and thus it is possible to suppress a decrease in the power consumption W. Moreover, in the present embodiment, in order to be able to readily understand from the equation of the power consumption described above, the power consumption W of the heater 45 is set to the same value when the voltage V=AC 200 V is established and when the voltage V=AC 100 V is established. Therefore, even if the AC power supply 10 is AC 200 V or AC 100 V, a heat generation amount of the heater 45 is the same, and thus it is possible to stably dry the ink discharged onto the print medium. Therefore, it is possible to prevent a drying difficulty due to an insufficient heat generation amount of the heater 45, deformation of the print medium S due to an excessive heat generation amount of the heater 45, or defects of the print mechanism 21 by the heat. In addition, when the peak voltage Vm is a first threshold value Vth1 or less, it is regarded as not being connected to the AC power supply 10, and thus it is possible to open the electrical path of the heater 45.

Herein, the correspondence relation between constituent elements of the present embodiment and the constituent elements of the invention will be obvious. The AC voltage detection circuit 62 of the present embodiment corresponds to an AC voltage detection circuit of the invention, the input terminals 62a and 62b correspond to a pair of input terminals, the limiting circuit 70 corresponds to a limiting circuit, the first detection circuit 81 corresponds to a first detection circuit, the second detection circuit 82 corresponds to a second detection circuit, the first limiting circuit 71 corresponds to a first limiting circuit, the second limiting circuit 72 corresponds to a second limiting circuit, the limiting resistor 85 corresponds to a limiting resistor, the heater control section 61 corresponds to a heater control device, the control circuit 64 and the voltage switching circuit 63 correspond to a control section, the print head 24 corresponds to a head, and the heater 45 corresponds to a heater.

According to the printer 20 of the present embodiment described above, when the positive voltage applied to a pair of the input terminals 62a and 62b by the AC power supply 10 exceeds the first threshold value Vth1, and the first limiting circuit 71 of the limiting circuit 70 allows the current, the first detection circuit 81 detects the allowance of the current. In addition, when the absolute value of the negative voltage applied to the pair of input terminals 62a and 62b by the AC power supply 10 exceeds the second threshold value Vth2, and the second limiting circuit 72 of the limiting circuit 70 allows the current, the second detection circuit 82 detects the allowance of the current. Then, the first threshold value Vth1 and the second threshold value Vth2 are different from each other. Therefore, it changes whether or not the limiting circuit 70 allows the current when the voltage input from the AC power supply exceeds both the first threshold value Vth1 and the second threshold value Vth2, exceeds any one of the first threshold value Vth1 and the second value Vth2, and does not exceed both the first threshold value Vth1 and the second threshold value Vth2, and therefore the detection results of the first and second detection circuits 81 and 82 change. As described above, the limiting circuit 70, the first detection circuit 81 and the second detection circuit 82 are used, and thereby it is possible to detect the voltage input from the AC power supply 10 using a simpler configuration. Since the AC power supply 10 is applied to the AC voltage detection circuit 62 as it is, a substrate area of the circuit tends to become larger, for example, a spatial distance for insulation is required compared with the circuit operating at DC 5 V. However, it is possible to suppress the increase in the substrate area by making the circuit configuration of the AC voltage detection circuit 62 simple.

In addition, the first limiting circuit 71 has a Zener diode ZD1, the second limiting circuit 72 has the Zener diodes ZD2 and ZD3 connected in series to each other. Therefore, it is possible to detect the voltage input from the AC power supply using the Zener diodes by making the circuit configuration simple. In addition, the Zener diodes ZD1 to ZD3 are the same element, the number of the Zener diodes in first limiting circuit 71 and the second limiting circuit 72 is changed, and therefore the first threshold value Vth1 and the second threshold value Vth2 value are caused to be different from each other.

Further, the first and second detection circuits 81 and 82 are connected in series with the limiting circuit 71, and thus the current allowed by the limiting circuit 70 flows through the first and second detection circuits 81 and 82 itself. Therefore, the limiting circuit 70 can easily detect whether the limiting circuit 70 allows the current.

Furthermore, the first and second detection circuits 81 and 82 are configured by the photo coupler PC1 and the photo coupler PC2. Therefore, whether the limiting circuit 70 allows the current or not may be easily detected by turning on and off the phototransistors PT1 and PT2. In addition, the limiting circuit 64 connected to the phototransistor may be insulated from the AC power supply 10.

In addition, the first detection circuit 81 and the second detection 82 are connected in parallel with each other, and the light emitting diode LED1 and the light emitting diode LED2 are connected in the opposite direction. Therefore, even if the voltage applied from the AC power supply 10 is any one of the positive and negative, it is possible to prevent the overvoltage from being applied to the light emitting diodes LED1 and LED2.

Further, the light emitting diode and the phototransistor to which the voltage is applied from the AC power supply are insulated from each other. Therefore, for example, it is possible to insulate the circuit connected to the phototransistor, such as a circuit using the detection results of the first and second detection circuits, from the AC power supply 10.

Furthermore, the limiting resistor 85 is connected in series with the limiting circuit 70 between the pair of the input terminals 62a and 62b, and is connected in series with the first detection circuit 81 and the second detection circuit 82. Accordingly, it is possible to suppress the current flowing through the limiting circuit 70 and the first and second detection circuits 81 and 82 by the AC power supply 10 to be small, and thus prevent the overvoltage. In addition, the limiting resistor 85 is connected to the input terminal 62a side rather than the parallel branch point 62c when viewed from the first and second detection circuits 81 and 82. Therefore, the resistor can be shared compared with a case where the resistor is connected in series with each of the first detection circuit 81 and the second detection circuit 82.

Furthermore, the control circuit 64 switches the voltage switching circuit 63 to control the power consumption W of the heater 45 based on the presence or absence of the detection of the first detection circuit 81 and the second detection circuit 82. Therefore, it is possible to detect a state of the voltage input from the AC power supply 10, and to perform the control of the heater 45 according to each state.

In addition, the invention is not limited to the above-described embodiments, and may be implemented in various aspects within the technical scope of the present invention.

For example, in the above-described embodiment, the first limiting circuit 71 is provided with a single Zener diode, and the second limiting circuit 72 is provided with two Zener diodes, but the present invention is not limited thereto, and the first limiting circuit 71 may include a plurality of Zener diodes, and the second circuit 72 may include a single Zener diode. In addition, all the Zener diodes ZD1 to ZD3 are assumed to be the same element, but the Zener voltages VZ1 to VZ3 or the forward voltages VF1 to VF3 may be different elements.

Figure 6:
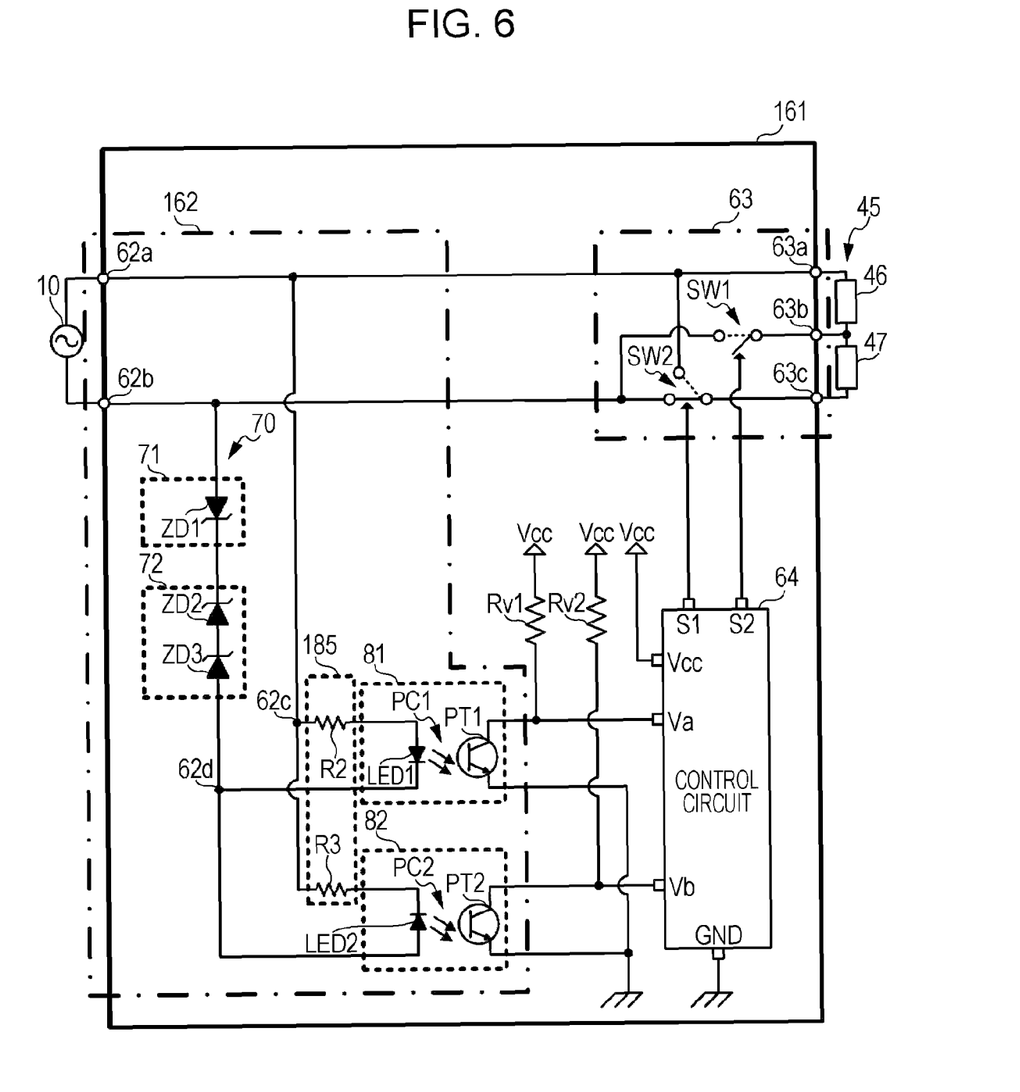
FIG. 6 is a circuit diagram of a heater control section of a modification example.

In above-described embodiment, the limiting resistor 85 is connected to the input terminal 62a side rather than the parallel branch point 62c when viewed from the first detection circuit 81 and the second detection circuit 82, but may be connected to the input terminal 62b side rather than a branch point 62d. In addition, the resistor may be connected in series with each of the first detection circuit 81 and the second detection circuits 82. FIG. 6 illustrates a circuit diagram of a heater control section 161 of a modification example in this case. The same reference numerals are used in the same configuration elements as in FIG. 2 in the heater control section 161. Therefore, the description thereof is omitted. The heater control section 161 has the same configuration as the heater control section 61 in FIG. 2 except having an AC voltage detection circuit 162 including the limiting resistor 185 in place of the limiting resistor 85. As illustrated, the limiting resistor 185 includes a resistor R2 which is serially connected across an anode of the light emitting diode LED1 of the first detection circuit 81 and the branch point 62c, and a resistor R3 which is serially connected across a cathode of the light emitting diode LED2 of the second detection circuit 82 and the branch point 62c. In this way, it is possible to suppress the current flowing through the AC voltage detection circuit 162 by the resistors R2 and R3 of the limiting resistor 185. In addition, a resistor R2 may be connected across the light emitting diode LED1 and the branch point 62d, and the resistor R3 may be connected across the light emitting diode LED2 and the branch point 62d.

In the above-described embodiment, the limiting circuit 70 is connected across the branch point 62d and the input terminal 62b, but may be connected across the input terminal 62a and the branch point 62c. In addition, the first limiting circuit 71 is connected across the branch point 62d and the input terminal 62b, and the second limiting circuit 72 is connected across the input terminal 62a and the branch point 62c, that is, the first limiting circuit 71 and the second limiting circuit 72 may be connected to be divided across the input terminal 62a and 62b.

In the above-described embodiment, it is assumed that the second threshold value Vth2 is greater than the first threshold vth1, but the value between the first threshold value Vth1 and the second threshold value Vth2 may be different from each other, and the first threshold value Vth1 may be greater than the second threshold value Vth2. The relationship between the first voltage V1 and the second voltage V2 is the same.

In the above-described embodiment, the positive and negative voltages of the AC power supply 10 are described with reference to the potential of the input terminal 62b, but the potential of the input terminal 62a may be considered as the reference. In this case, the first limiting circuit 71 in FIG. 2 corresponds to a second limiting circuit of the invention, the second limiting circuit 72 corresponds to a first limiting circuit of the invention, the first detection circuit 81 corresponds to a second detection circuit of the invention, and the second detection circuit 82 corresponds to a first detection circuit of the invention.

In the above-described embodiment, it is assumed that the control circuit 64 determines whether the Va terminal and the Vb terminal are set to be low during a predetermined period, and outputs a signal from the S1 terminal and the S2 terminal based on the determination result, but as long as the power consumption of the heater 45 is controlled based on the detection result by the first detection circuit 81 and the second detection circuit 82, it is not limited thereto. For example, by whether or not the voltage value after the smoothing obtained by smoothing the voltage between the collector and the cathode of the phototransistor PT1 is a predetermined threshold value or less, the first detection circuit 81 may control the power consumptions in such a way that the control circuit determines whether the first detection circuit 81 detects whether the phototransistor PT1 is turned on or not, that is, detects the allowance of the current in which the positive voltage is applied to the first limiting circuit 71. The determination result of the second detection circuit 82 is the same.

In the above-described embodiment, it is assumed that the control circuit 64 determines three states, that is, whether the peak voltage Vm>the second threshold value Vth2, the second threshold value Vth2≥the peak voltage Vm>the first threshold value Vth1 and the first threshold value Vth1≥the peak voltage Vm by whether the Va terminal and the Vb terminal are set to be low during a predetermined period, but may determine the voltage of the AC power supply 10 based on the length of the period during which the Va terminal and the Vb terminal become low (the length of the period during which the limiting circuit 70 allows the current). For example, between the time t1 and the time t2 in FIG. 3, and the time t5 and the time t6 in FIG. 4, a side between the time t1 and the time t2 at which the peak voltage Vm of the AC power supply 10 is a high value becomes a longer period. As described above, the length of a period during which the Va terminal or the Vb terminal is set to be low has a correlation with the peak voltage Vm of the AC power supply 10. Therefore, it is possible to detect the voltage of the AC power supply 10 by measuring the period, and thus to more accurately detect the voltage of the AC power supply 10.

In the above-described embodiment, the heater 45 includes the first load 46 and the second load 47, but may include three or more loads. In addition, the resistance values of the first load 46 and the second load 47 have the same value, but may have different values.

In the above-described embodiment, the control circuit 64 switches whether the first load 46 and the second load 47 are connected in series or in parallel with each other by switching the voltage switching circuit 63. Therefore, the resistance value of the heater 45 is changed, and therefore the power consumption is controlled, but it is not limited thereto. For example, the resistance value of the heater 45 may be changed by performing the switching as to whether the current is allowed to flow in all the first load 46 and the second load 47 or in any of them, that is, by performing the switching as to whether the current is allowed to flow in any one of a plurality of loads. In addition, in the heater 45, the power consumption may be controlled in such a way that the voltage between the input terminals 62a and 62b is transformed, the transformed voltage is supplied to the heater 45, and thereby the transformation rate is changed to control the voltage of the heater 45.

In the above-described embodiment, the heater controller section 61 controls the power consumption of the heater 45 in such a way that the print medium S is heated to dry the ink discharged onto the print medium S in the printer 20, but may control a heater, such as a heater used for another use of the printer 20 or a heater used in devices other than the printer 20.

In the above-described embodiment, the AC voltage detection circuit 62 has been described as being used in the heater control section 61, but may detect the voltage input from the AC power supply, and may use the detection result in order to control devices other than a heater.

The entire disclosure of Japanese Patent Application No. 2012-32559, filed Feb. 17, 2012 is expressly incorporated by reference herein.

What is claimed is:
1. An AC voltage detection circuit that detects a voltage input from an AC power supply comprising:
a pair of input terminals to which a voltage is applied from the AC power supply;
a limiting circuit that allows a current when a positive voltage applied to the input terminals exceeds a predetermined first threshold value, and allows a current when an absolute value of a negative voltage applied to the input terminals exceeds a predetermined second threshold value different from the first threshold value;
a first detection circuit that detects that the positive voltage is applied to the input terminals and thus the limiting circuit allows the current; and
a second detection circuit that detects that the negative voltage is applied to the input terminals and thus the limiting circuit allows the circuit
wherein the limiting circuit is a circuit including a first limiting circuit that is connected across the pair of input terminals to allow a current when the positive voltage applied to the first limiting circuit exceeds a predetermined first voltage and a second limiting circuit that is connected in series with the first limiting circuit between the pair of input terminals to allow a current when an absolute value of the negative voltage applied to the second limiting circuit exceeds a predetermine second voltage different from the first voltage.

2. The AC voltage detection circuit according to claim 1, wherein the first threshold value is a voltage across the input terminals when a positive partial pressure applied to the first limiting circuit is set to the first voltage V1,
wherein the second threshold value is an absolute value of a voltage across the input terminals when an absolute value of a negative partial pressure applied to the second limiting circuit is set to the second voltage V2,
wherein the first detection circuit is a circuit that detects that the positive voltage is applied to the first limiting circuit and thus the first limiting circuit allows the current and,
wherein the second detection circuit is a circuit that detects that the negative voltage is applied to the second limiting circuit and thus the second limiting circuit allows the current.

3. The AC voltage detection circuit according to claim 2, wherein the first limiting circuit is a circuit that has a Zener diode of which a cathode is connected to a high potential side and of which an anode is connected to a low potential side when the positive voltage is applied to the input terminals and in which the first voltage is a value based on the Zener voltage of the Zener diode, and
wherein the second limiting circuit is a circuit that has a Zener diode of which a cathode is connected to the high potential side and of which an anode is connected to the low potential side when the negative voltage is applied to the input terminals, and in which the second voltage is a value based on a Zener voltage of the Zener diode.

4. The AC voltage detection circuit according to claim 1, wherein the first detection circuit is a circuit that is connected in series with the limiting circuit across the pair of input terminals, and that detects that the positive voltage is applied to the input terminals and thus the limiting circuit allows the current based on a current flowing through the first detection circuit, and
wherein the second detection circuit is a circuit that is connected in series with the limiting circuit across the pair of the input terminals, and that detects that the negative voltage is applied to the input terminals and thus the limiting circuit allows the current based on the current flowing through the second detection circuit.

5. The AC voltage detection circuit according to claim 4, wherein the first detection circuit and the second detection circuit are connected in parallel with each other, and
wherein the limiting circuit is connected to the input terminal side from a parallel branch point when viewed from the first detection circuit and the second detection circuit.

6. The AC voltage detection circuit according to claim 5, wherein the first detection circuit includes a photocoupler having a phototransistor and a light emitting diode of which an anode is connected to the high potential side and of which a cathode is connected to the low potential side when the positive voltage is applied to the input terminals, and
wherein the second detection circuit includes a photocoupler having a phototransistor and a light emitting diode of which an anode is connected to the high potential side and of which a cathode is connected to a low potential side when the negative voltage is applied to the input terminals.

7. The AC voltage detection circuit according to claim 5 further comprising:

a limiting resistor that is connected in series with the limiting circuit across the pair of input terminals and that is connected to the input terminal side from the parallel branch point when viewed the first detection circuit and the second detection circuit.

8. The AC voltage detection circuit according to claim 1, further comprising:
a limiting resistor connected in series with the limiting circuit across the pair of input terminals.

9. A heater control device that controls a heater operated by an electrical power supplied from an AC power supply comprising:
the AC voltage detection circuit according claim 1; and
a control section that controls a power consumption of the heater based on a presence or an absence of the detection in the first detection circuit and the second detection circuit.

10. A heater control device that controls the heater operated by an electrical power supplied from an AC power supply comprising:
the AC voltage detection circuit according to claim 2; and
a control section that controls a power consumption of the heater based on a presence or an absence of the detection in the first detection circuit and the second detection circuit.

11. A heater control device that controls the heater operated by an electrical power supplied from an AC power supply comprising:
the AC voltage detection circuit according to claim 3; and
a control section that controls a power consumption of the heater based on a presence or an absence of the detection in the first detection circuit and the second detection circuit.

12. A heater control device that controls the heater operated by an electrical power supplied from an AC power supply comprising:
the AC voltage detection circuit according to claim 4; and
a control section that controls a power consumption of the heater based on a presence or an absence of the detection in the first detection circuit and the second detection circuit.

13. A heater control device that controls the heater operated by an electrical power supplied from an AC power supply comprising:
the AC voltage detection circuit according to claim 5; and
a control section that controls a power consumption of the heater based on a presence or an absence of the detection in the first detection circuit and the second detection circuit.

14. A heater control device that controls the heater operated by an electrical power supplied from an AC power supply comprising:
the AC voltage detection circuit according to claim 6 and a control section that controls a power consumption of the heater based on a presence or an absence of the detection in the first detection circuit and the second detection circuit.

15. A heater control device that controls the heater operated by an electrical power supplied from an AC power supply comprising:
the AC voltage detection circuit according to claim 7; and
a control section that controls a power consumption of the heater based on a presence or an absence of the detection in the first detection circuit and the second detection circuit.

16. A heater control device that controls the heater operated by an electrical power supplied from an AC power supply comprising:
the AC voltage detection circuit according to claim 8; and
a control section that controls a power consumption of the heater based on a presence or an absence of the detection in the first detection circuit and the second detection circuit.

17. An image forming device comprising:
the heater control device according to claim 9;
a head that discharges a liquid to form an image on a medium; and
a heater that is operated by an electrical power supplied from the AC power supply, of which a power consumption is controlled by the heater control device and by which the medium is heated to dry the liquid discharged on the medium.

18. An image forming device comprising:
the heater control device according to claim 10;
a head that discharges a liquid to form an image on a medium; and
a heater that is operated by an electrical power supplied from the AC power supply, of which a power consumption is controlled by the heater control device and by which the medium is heated to dry the liquid discharged on the medium.

19. An image forming device comprising:
the heater control device according to claim 11;
a head that discharges a liquid to form an image on a medium; and
a heater that is operated by an electrical power supplied from the AC power supply, of which a power consumption is controlled by the heater control device and by which the medium is heated to dry the liquid discharged on the medium.

20. An image forming device comprising:
the heater control device according to claim 12;
a head that discharges a liquid to form an image on a medium; and
a heater that is operated by an electrical power supplied from the AC power supply, of which a power consumption is controlled by the heater control device and by which the medium is heated to dry the liquid discharged on the medium.

* * * * *